(12) United States Patent
Nakamura (10) Patent No.: US 11,380,550 B2
(45) Date of Patent: Jul. 5, 2022

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 142 days.

(21) Appl. No.: 17/095,050

(22) Filed: Nov. 11, 2020

(65) Prior Publication Data

US 2021/0159080 A1 May 27, 2021

(30) Foreign Application Priority Data

Nov. 25, 2019 (JP) .............................. JP2019-212672

(51) Int. Cl.
| | | |
|---|---|---|
| *H01L 21/304* | (2006.01) | |
| *H01L 21/78* | (2006.01) | |
| *B23K 26/57* | (2014.01) | |
| *B23K 26/361* | (2014.01) | |
| *B23K 101/40* | (2006.01) | |

(52) U.S. Cl.
CPC ........ *H01L 21/3043* (2013.01); *B23K 26/361* (2015.10); *B23K 26/57* (2015.10); *H01L 21/78* (2013.01); *B23K 2101/40* (2018.08)

(58) Field of Classification Search
CPC ... H01L 21/3043; H01L 21/78; H01L 21/304; H01L 21/6835; H01L 2221/68327; H01L 21/187; H01L 21/6836; B23K 26/361; B23K 26/57; B23K 2101/40; B23K 26/0823; B23K 26/0853; B23K 26/0876; B23K 26/53; B23K 26/0006; B23K 2103/56

See application file for complete search history.

(56) References Cited

U.S. PATENT DOCUMENTS

| | | | | |
|---|---|---|---|---|
| 2003/0092244 | A1* | 5/2003 | Oi | H01L 21/681 438/455 |
| 2009/0079038 | A1* | 3/2009 | Schneegans | H01L 21/78 257/E23.179 |
| 2014/0305916 | A1* | 10/2014 | Wei | B23K 26/324 219/121.64 |
| 2017/0033011 | A1* | 2/2017 | Rupp | H01L 29/8611 |
| 2020/0343095 | A1* | 10/2020 | Harada | B24B 7/228 |

FOREIGN PATENT DOCUMENTS

JP 2010225976 A 10/2010

* cited by examiner

*Primary Examiner* — Thanh T Nguyen
(74) *Attorney, Agent, or Firm* — Greer Burns & Crain Ltd.

(57) ABSTRACT

A wafer processing method for processing a wafer of a two-layer structure having a second wafer laminated on a front surface of a first wafer includes a stepped part forming step of cutting from the second wafer side to a peripheral surplus region of the first wafer to a depth corresponding to a finished thickness of the first wafer, thereby removing a chamfered part formed at a peripheral end of the second wafer and forming an annular stepped part in the peripheral surplus region of the first wafer, and a second wafer griding step of, after the stepped part forming step is carried out, grinding an exposed surface of the second wafer to make the second wafer to have a predetermined thickness.

3 Claims, 8 Drawing Sheets

WAFER PROCESSING METHOD

BACKGROUND OF THE INVENTION

Field of the Invention

The present invention relates to a wafer processing method for processing a wafer of a two-layer structure in which a second wafer is laminated on a front surface of a first wafer.

Description of the Related Art

A wafer provided on a front surface thereof with a device region in which a plurality of devices such as integrated circuits (ICs) and large-scale integration (LSI) circuits are formed in a state of being partitioned by a plurality of intersecting streets and a peripheral surplus region surrounding the device region is formed to a predetermined thickness by grinding a back surface, after which the wafer is divided into individual device chips by a dicing apparatus or a laser processing apparatus, and the thus divided device chips are utilized for electric appliances such as mobile phones and personal computers.

In addition, a wafer of a two-layer structure obtained by adhering front surfaces of wafers formed with devices to each other is also formed to a predetermined thickness by grinding back surfaces of the wafers, after which the wafer is divided into individual device chips by a dicing apparatus or a laser processing apparatus (see, for example, Japanese Patent Laid-open No. 2010-225976).

SUMMARY OF THE INVENTION

When the back surface of the wafer on one side and the back surface of the wafer on the other side of the wafer of the two-layer structure described above are ground to thin the wafers, chamfered parts formed at peripheral ends of the wafers become sharp and thin like knife edges, and chipping may be generated during grinding. From the chipping, cracks may reach the device regions, thereby damaging the devices formed on the wafers. To solve this problem, it may be contemplated to remove by cutting the chamfered parts formed at the peripheral ends of the wafers, before grinding the back surfaces of the wafers.

However, as described above, in processing the wafer of the two-layer structure obtained by adhering the front surfaces of the wafers to each other, when the chamfered parts formed at the peripheral ends of the wafers are removed by cutting before grinding the exposed surfaces (back surfaces) of the wafers, notches formed as marks indicative of the crystal orientation of the wafer are lost, and the crystal orientation is unknown from external appearance, resulting in the problem that treatments in the subsequent steps are hindered.

Accordingly, it is an object of the present invention to provide a wafer processing method with which, in processing a wafer of a two-layer structure, a knife edge is not formed at a periphery even when back surfaces of wafers are ground to thin the wafers, and the wafer processing method being able to solve the problem that the notches indicative of the crystal orientation are lost and treatments in subsequent steps are thereby hindered.

In accordance with an aspect of the present invention, there is provided a wafer processing method for processing a wafer of a two-layer structure having a second wafer laminated on a front surface of a first wafer, the first wafer being provided on the front surface with a device region in which a plurality of devices are formed in a state of being partitioned by a plurality of intersecting streets and a peripheral surplus region surrounding the device region. The wafer processing method includes a stepped part forming step of cutting from the second wafer side to the peripheral surplus region of the first wafer to a depth corresponding to a finished thickness of the first wafer, thereby removing a chamfered part formed at a peripheral end of the second wafer and forming an annular stepped part in the peripheral surplus region of the first wafer, a second wafer grinding step of, after the stepped part forming step is carried out, grinding an exposed surface of the second wafer to make the second wafer have a predetermined thickness, an annular modified layer forming step of, after the second wafer grinding step is carried out, applying a laser beam of such a wavelength as to be transmitted through the first wafer while positioning a focal point of the laser beam inside a base of the stepped part formed in the peripheral surplus region of the first wafer to form an annular modified layer, a protective tape disposing step of, after the annular modified layer forming step is carried out, disposing a protective tape of a size corresponding to the first wafer on the exposed surface of the second wafer, and a first wafer grinding step of, after the protective tape disposing step is carried out, grinding an exposed surface of the first wafer to give a stimulus to the modified layer, to separate a ring-shaped region including the stepped part from the first wafer along the modified layer, to drop the region onto the protective tape, and to grind the first wafer to the finished thickness.

Preferably, the wafer processing method includes a cut groove forming step of, after the second wafer grinding step and before the protective tape disposing step, cutting from the second wafer side to the streets of the first wafer to form cut grooves including grooves of a depth corresponding to the finished thickness of the first wafer. In the first wafer grinding step, the wafer of the two-layer structure is divided into individual device chips.

Preferably, the wafer processing method includes a street modified layer forming step of, after the second wafer grinding step and before the protective tape disposing step, applying a laser beam of such a wavelength as to be transmitted through the first wafer and the second wafer from the second wafer side to form modified layers ranging from the second wafer to the streets of the first wafer. In the first wafer grinding step, the wafer of the two-layer structure is divided into individual device chips.

According to the present invention, a knife edge is not formed at the periphery of the wafer, even when the wafer on one side is thinned by grinding a wafer of a two-layer structure, so that the problem that chipping is generated during the grinding and cracks reach the device region to damage the devices is solved. In addition, even when the back surface of the first wafer is ground to form the wafer to a predetermined thickness, a ring-shaped region including a stepped part formed at the peripheral end of the first wafer drops to be transferred onto a protective tape, so that the notch indicative of the crystal orientation is left, and the problem that treatments in subsequent steps are hindered is solved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
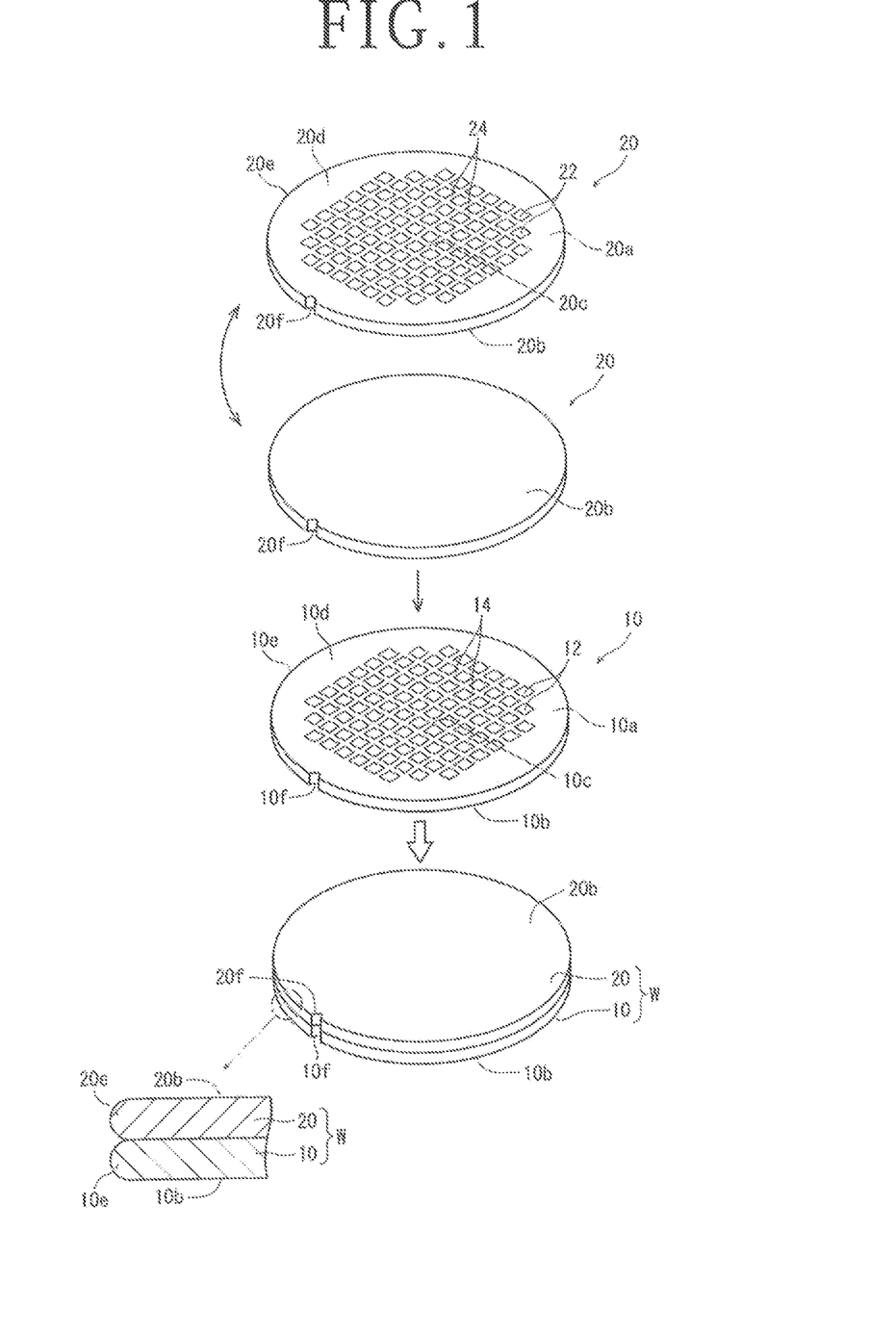
FIG. 1 is a perspective view depicting a mode of forming a two-layer structure by laminating front surfaces of a first wafer and a second wafer, and a wafer of the two-layer structure.

A wafer processing method according to embodiments of the present invention will be described in detail below, referring to the attached drawings. FIG. 1 depicts perspective views depicting a mode of forming a two-layer structure by adhering front surfaces of a first wafer 10 and a second wafer 20 to each other and a wafer W having the two-layer structure. The first wafer 10 includes, for example, a silicon substrate, is formed on a front surface 10a thereof with a plurality of devices 12 in the state of being partitioned by streets 14, and includes a device region 10c formed with the plurality of devices 12 and a peripheral surplus region 10d surrounding the device region 10c. The peripheral surplus region 10d is formed at a peripheral end thereof with a chamfered part 10e where upper and lower corner portions are removed, and with a notch (cutout) 10f indicative of the crystal orientation of the wafer 10.

The second wafer 20 has a configuration substantially similar to that of the first wafer 10. The second wafer 20 includes, for example, a silicon substrate, is formed on a front surface 20a thereof with a plurality of devices 22 in the state of being partitioned by streets 24, and includes a device region 20c formed with the plurality of devices 22 and a peripheral surplus region 20d surrounding the device region 20c. The peripheral surplus region 20d is formed at a peripheral end thereof with a chamfered part 20e and a notch (cutout) 20f indicative of the crystal orientation of the wafer 20.

In a case of forming the wafer W of the two-layer structure from the first wafer 10 and the second wafer 20 described above, as depicted at the upper part of FIG. 1, the second wafer 20 is inverted upside down to direct a back surface 20b upward, and, while positioning the wafers by the notch 10f of the first wafer 10 and the notch 20f of the second wafer 20, the second wafer 20 is adhered to a front surface 10a of the first wafer 10. In adhering the second wafer 20 to the first wafer 10, an adhesive, not illustrated, is applied to the front surface 10a of the first wafer 10, whereby the wafers can be united with each other. The streets 14 formed on the first wafer 10 and the streets 24 formed on the second wafer 20 are set in such a manner as to perfectly coincide with each other when the first wafer 10 and the second wafer 20 are adhered to each other. Therefore, when dividing the wafer W into individual device chips, the wafer W is divided along the streets 14 and 24. With the first wafer 10 and the second wafer 20 thus laminated on each other in this manner, the wafer W of the two-layer structure to be processed by the processing method of the present embodiment is formed. Note that, as understood from the sectional view depicting a peripheral end of the wafer W in an enlarged form at the lowermost part of FIG. 1, the first wafer 10 and the second wafer 20 constituting the wafer W are formed at peripheral ends thereof with a chamfered part 10e and a chamfered part 20e which are chamfered by removing upper and lower corner portions at the peripheral ends.

Figure 2A:
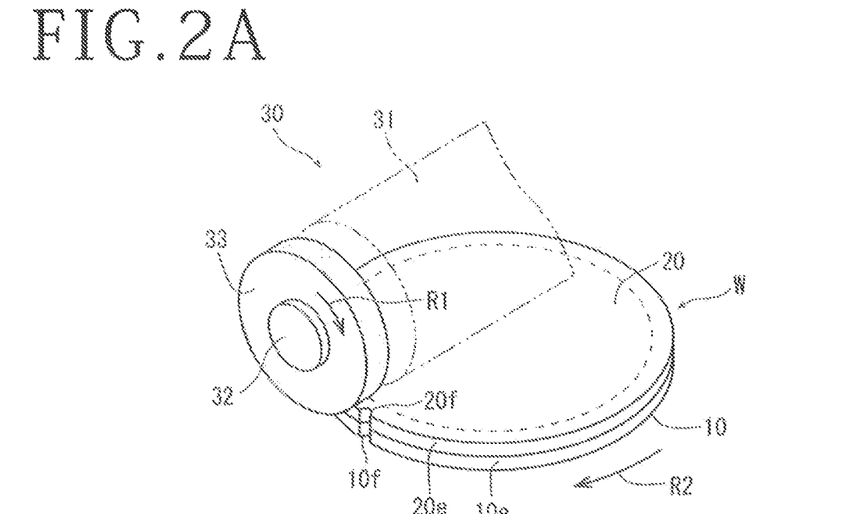
FIG. 2A is a perspective view depicting an embodiment of a stepped part forming step.

After the wafer W of the two-layer structure as described above is prepared, the wafer W is conveyed into a first cutting apparatus 30 (only a part is illustrated) depicted in FIG. 2A. The first cutting apparatus 30 includes, for example, a suction holding table, not illustrated, a spindle housing 31 (depicted in alternate long and two short dashes line), a spindle 32 held by the spindle housing 31, a cutting blade 33 fixed to a tip portion of the spindle 32, and a driving motor, not illustrated, provided at a rear end portion of the spindle housing 31 for rotating the spindle 32.

Figure 2B:
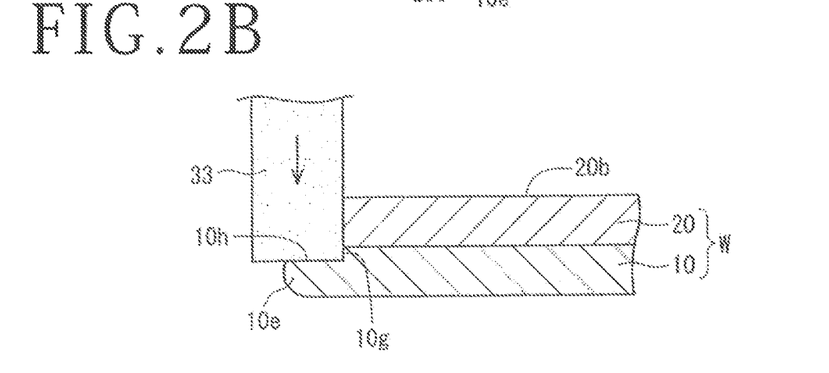
FIG. 2B is a sectional view depicting, in an enlarged form, a part of a mode of carrying out the stepped part forming step.
Figure 2C:
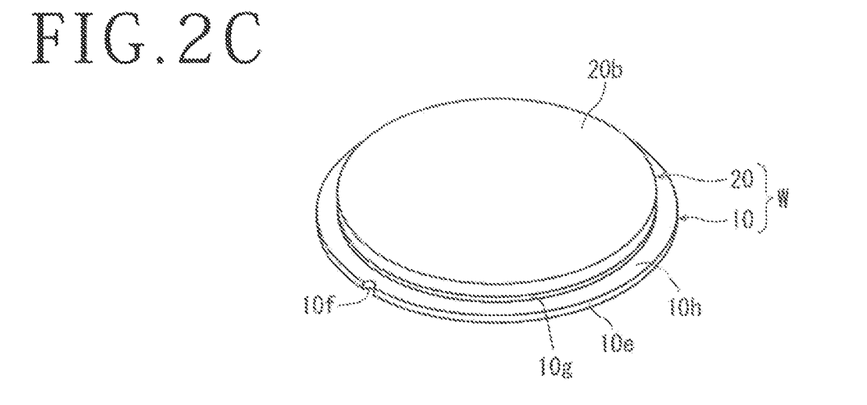
FIG. 2C is a perspective view depicting a wafer formed with a stepped part.

The wafer W conveyed into the first cutting apparatus 30 is placed on the suction holding table, with the first wafer 10 on the lower side and with the second wafer 20 on the upper side, and is suction held by operating a suction source, not illustrated. Next, as depicted in FIG. 2A, the cutting blade 33 is positioned on the upper side of a peripheral end of the wafer W held on the suction holding table, more specifically, a region including the chamfered part 20e formed at a peripheral end of the second wafer 20. Subsequently, the cutting blade 33 is rotated in the direction indicated by an arrow R1, the wafer W is rotated in the direction indicated by an arrow R2. In addition, as illustrated in FIG. 2B, the cutting blade 33 is lowered, to remove the region including the chamfered part 20e of the second wafer 20 over the whole circumference, and, reaching the first wafer 10, to cut to a depth (denoted by 10g in the figure) corresponding to a finished thickness of the first wafer 10. Since a peripheral end face of the cutting blade 33 is a flat surface as illustrated in the figure, the first wafer 10 is formed with an annular stepped part 10h over the whole circumference (stepped part forming step), as illustrated in FIGS. 2B and 2C. Note that, as understood from FIG. 2C, the notch 20f of the second wafer 20 is removed completely, but the notch 10f of the first wafer 10 is left.

Next, a second wafer grinding step is carried out in which the back surface 20b side, which is the exposed surface, of the second wafer 20 is ground to obtain a predetermined thickness. In carrying out the second wafer grinding step, the wafer W is conveyed to a grinding apparatus 40 (only a part is illustrated) depicted in FIGS. 3 and 4. The grinding apparatus 40 includes a chuck table 41, which is configured to be rotatable by a rotational driving mechanism, not illustrated, and a holding surface 41a of which includes a gas-permeable porous material. The chuck table 41 is connected to a suction source, not illustrated, and, by operating the suction source, a negative pressure is generated on the holding surface 41a of the chuck table 41. Further, the grinding apparatus 40 includes grinding means 42 for grinding and thinning the wafer W placed on the chuck table 41, as depicted in FIG. 4A. The grinding means 42 includes a spindle 43 rotated by a rotational driving mechanism, not illustrated, a mounter 44 mounted to a lower end of the spindle 43, and a grinding wheel 45 attached to a lower surface of the mounter 44, with grindstones 46 disposed in an annular pattern on a lower surface of the grinding wheel 45, as illustrated in FIG. 4A.

Figure 3:
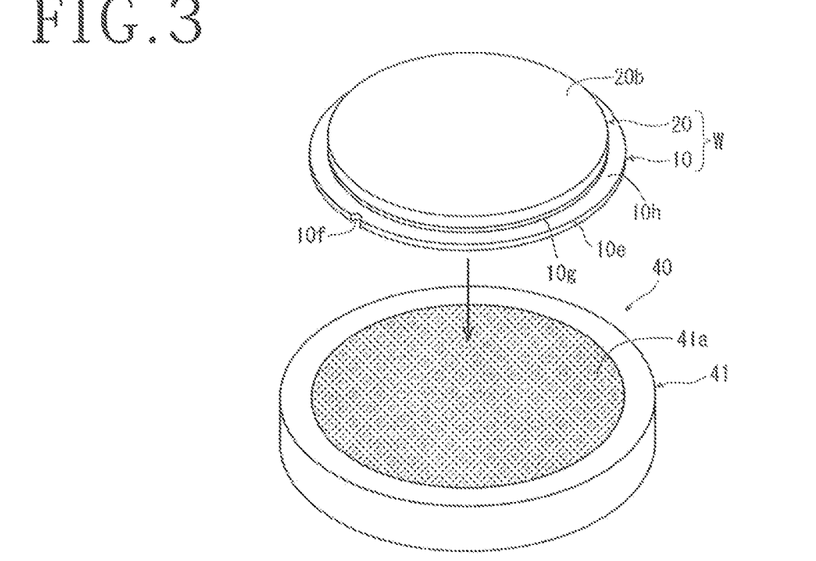
FIG. 3 is a perspective view depicting a mode of placing a wafer on a chuck table at the time of carrying out a second wafer grinding step.
Figure 4A:
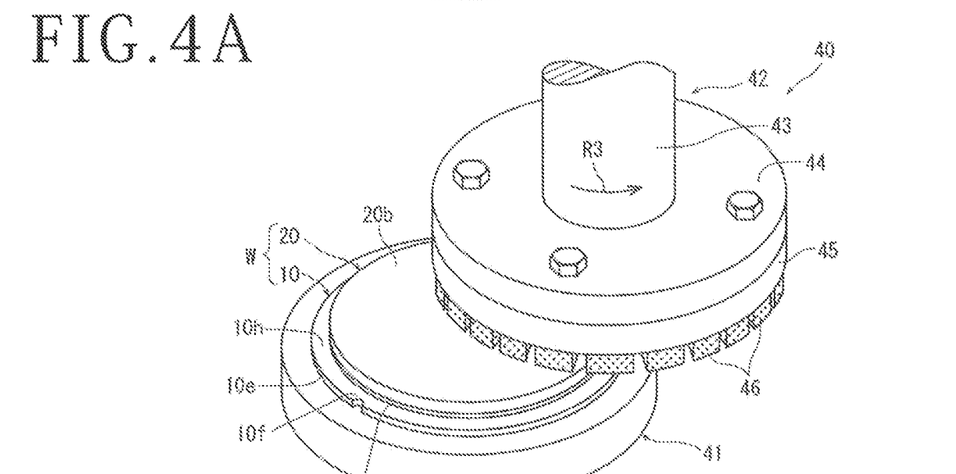
FIG. 4A is a perspective view depicting an embodiment of the second wafer grinding step.

After the wafer W is conveyed to the grinding apparatus 40, the wafer W is placed on the holding surface 41a of the chuck table 41, with the first wafer 10 side of the wafer W directed to the lower side and with the second wafer 20 side directed to the upper side, the first wafer and the second wafer constituting the wafer W, as depicted in FIG. 3, and is suction held by operating the suction source. Note that, at the time of holding the wafer W on the chuck table 41, a protective tape may be disposed between the first wafer 10 and the chuck table 41.

Figure 4B:
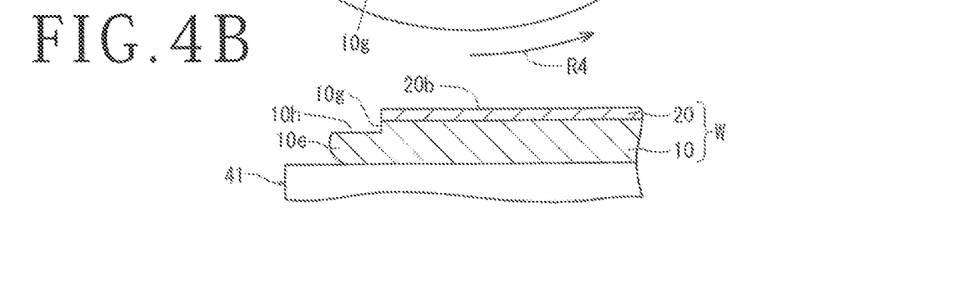
FIG. 4B is a sectional view depicting, in an enlarged form, a part of a wafer subjected to the second wafer grinding step.

After the wafer W is suction held on the chuck table 41, while rotating the spindle 43 of the grinding means 42 at, for example, 6,000 rpm in the direction indicated by an arrow R3 in FIG. 4A, the chuck table 41 is rotated at, for example, 300 rpm in the direction indicated by an arrow R4. Then, the grinding means 42 is lowered to bring the grindstones 46 into contact with the back surface 20b of the second wafer 20, and the grinding wheel 45 is put into grinding feeding in the direction perpendicular to the second wafer 20 at a grinding feeding speed of, for example, 1 μm/second. In this instance, the grinding can be advanced while measuring the thickness of the wafer W by a non-contact-type measuring gauge, not illustrated, and the back surface 20b of the second wafer 20 is ground to thin the second wafer 20 to a predetermined thickness, whereby the second wafer grinding step is completed, as depicted in FIG. 4B. In the present embodiment, the periphery including the chamfered part 20e of the second wafer 20 is preliminarily removed. Therefore, even when the back surface 20b of the second wafer 20 is ground for thinning, a knife edge is not formed at the peripheral end of the second wafer 20, so that the problem that chipping occur during grinding and cracks reach the device region 20c of the second wafer 20 to damage the devices 22 is solved.

Figure 5:
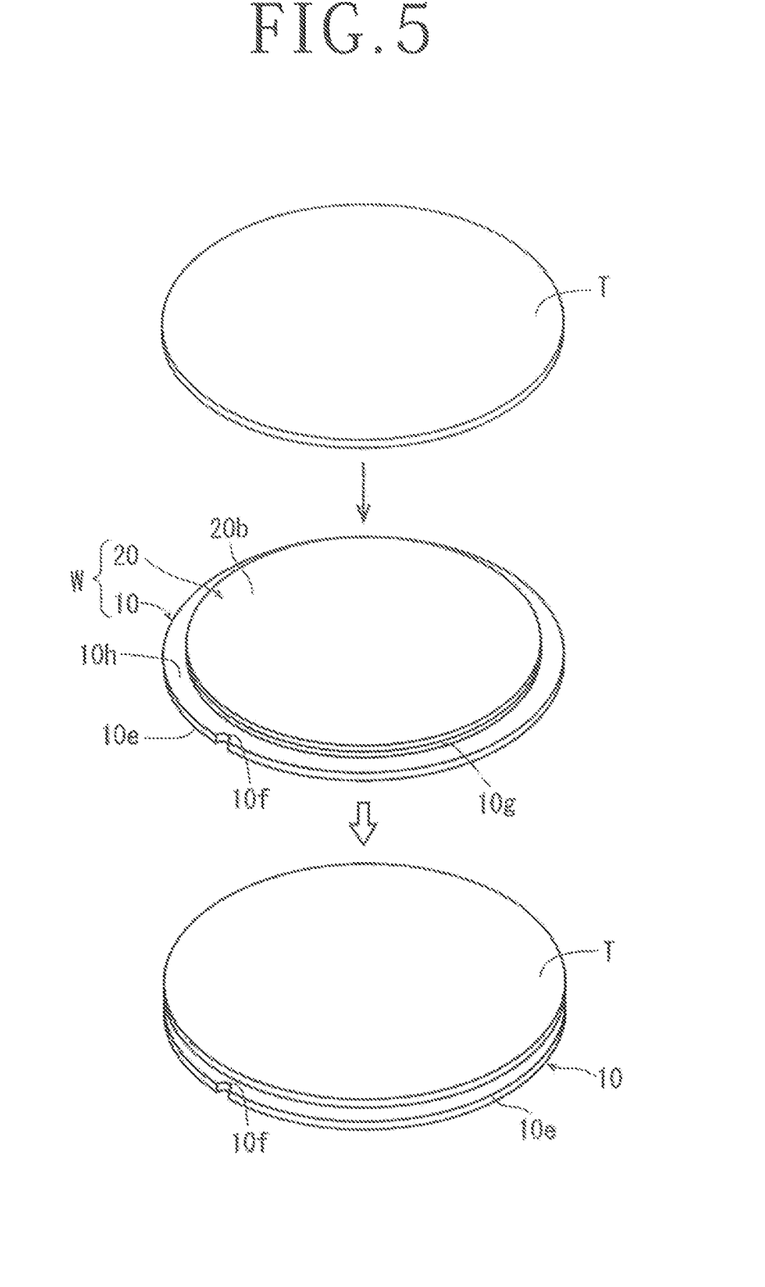
FIG. 5 is a perspective view depicting an embodiment of a protective tape disposing step.

After the second wafer grinding step is completed, an annular modified layer forming step of forming a modified layer in an annular form inside a base of the stepped part 10h formed in the peripheral surplus region 10d of the first wafer 10 and a protective tape disposing step of disposing a protective tape T of a size corresponding to the first wafer 10 on the side of an exposed surface (back surface 20b) of the second wafer 20 are carried out. In the present embodiment, first, as depicted in FIG. 5, a protective tape T of a size corresponding to the first wafer 10 is disposed on and adhered to the back surface 20b of the second wafer 20 (protective tape disposing step).

Figures 6A, 6B:
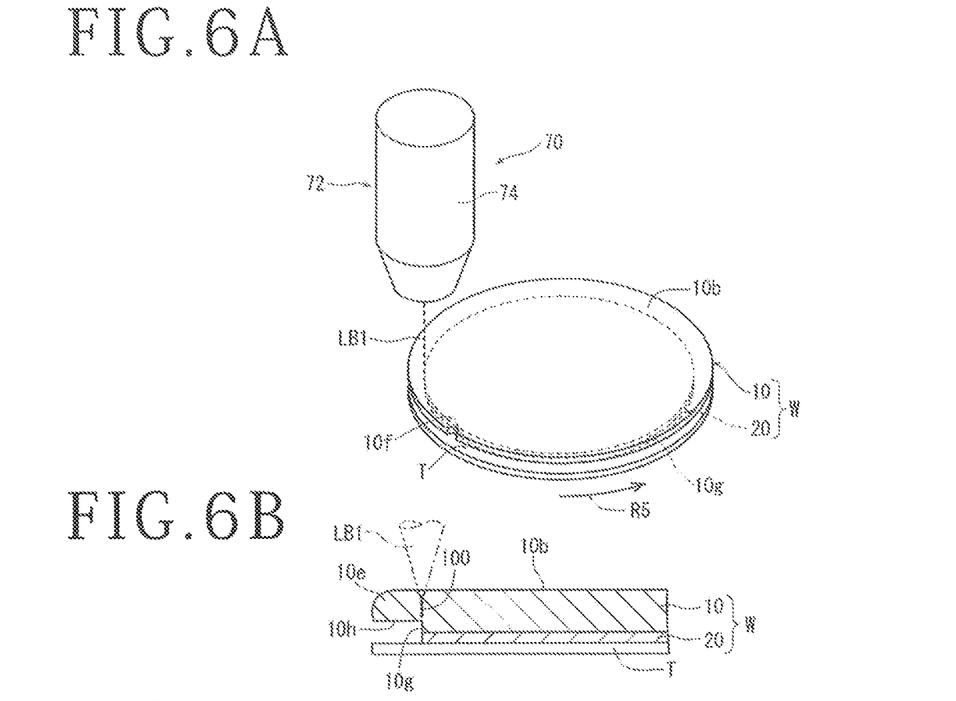
FIG. 6A is a perspective view depicting an embodiment of an annular modified layer forming step.
FIG. 6B is a sectional view depicting, in an enlarged form, a part of the embodiment depicted in FIG. 6A.

Next, the wafer W with the protective tape T adhered thereto is conveyed to a first laser processing apparatus 70 depicted in FIG. 6A. The first laser processing apparatus 70 includes a rotatable chuck table, not illustrated, laser beam applying means 72, and moving means, not illustrated, for relatively moving the chuck table and the laser beam applying means 72. The chuck table is gas-permeable and is connected to a suction source, not illustrated. The laser beam applying means 72 includes a laser oscillator that oscillates a laser of such a wavelength as to be transmitted through the first wafer 10 and an optical system (both not illustrated) including output adjusting means and the like, and applies a laser beam LB1 through a condenser 74 including a condenser lens.

After the wafer W is conveyed to the first laser processing apparatus 70, as depicted in FIG. 6A, the wafer W is placed on the chuck table, with the first wafer 10 constituting the wafer W on the upper side and with the protective tape T on the lower side, and is suction held. Next, the condenser 74 of the laser beam applying means 72 is positioned on the peripheral side of the first wafer 10. Thereafter, as illustrated in FIGS. 6A and 6B, the laser beam LB1 is applied, with a focal point of the laser beam LB1 positioned inside the base of the stepped part 10h formed in the first wafer 10, and the wafer W is rotated in the direction indicated by an arrow R5 in FIG. 6A. Further, the focal point of the laser beam LB1 is positioned at a plurality of positions different in the thickness direction of the wafer W, and the wafer W is rotated in the direction indicated by the arrow R5, whereby laser processing is carried out repeatedly. As a result, as depicted in FIG. 6B, an annular modified layer 100 is formed along the inside of the base of the stepped part 10h (annular modified layer forming step). Note that, at the time of forming the modified layer 100, application of the laser beam LB1 may be started by first positioning the focal point at a position in the vicinity of the base of the stepped part 10h, and the modified layer 100 may be formed such as to gradually spread to the peripheral end side of the wafer W, that is, such that the modified layer 100 is inclined, as the focal point is moved toward the back surface 10b side of the first wafer 10.

Note that laser processing conditions at the time of carrying out the annular modified layer forming step described above are set, for example, as follows.

Wavelength: 1,342 nm
    Repetition frequency: 90 kHz
    Average output: 0.6 W
    Wafer rotation speed: 0.5 revolution/second In the present embodiment, the annular modified layer forming step is carried out by applying the laser beam LB1 from the back surface 10b side of the first wafer 10 after the protective tape disposing step is carried out, but the present invention is not limited to this. For example, the annular modified layer forming step may be carried out by applying the laser beam LB1 from the back surface 20b side of the second wafer 20. In that case, before carrying out the protective tape disposing step for the wafer W having undergone the second wafer grinding step described above, the wafer W is conveyed to the first laser processing apparatus 70 illustrated in FIG. 6A, and is placed on the chuck table, not illustrated, with the back surface 10b of the first wafer 10 directed to the lower side and with the back surface 20b of the second wafer 20 directed to the upper side. Then, the laser beam LB1 is applied, with the focal point of the laser beam LB1 positioned inside the base of the stepped part 10h of the first wafer 10, and the wafer W is rotated in the direction indicated by an arrow R5 together with the chuck table, whereby a modified layer similar to the above-described modified layer 100 is formed. After this annular modified layer forming step is carried out, the protective tape disposing step described above referring to FIG. 5 is carried out.

Figure 7:
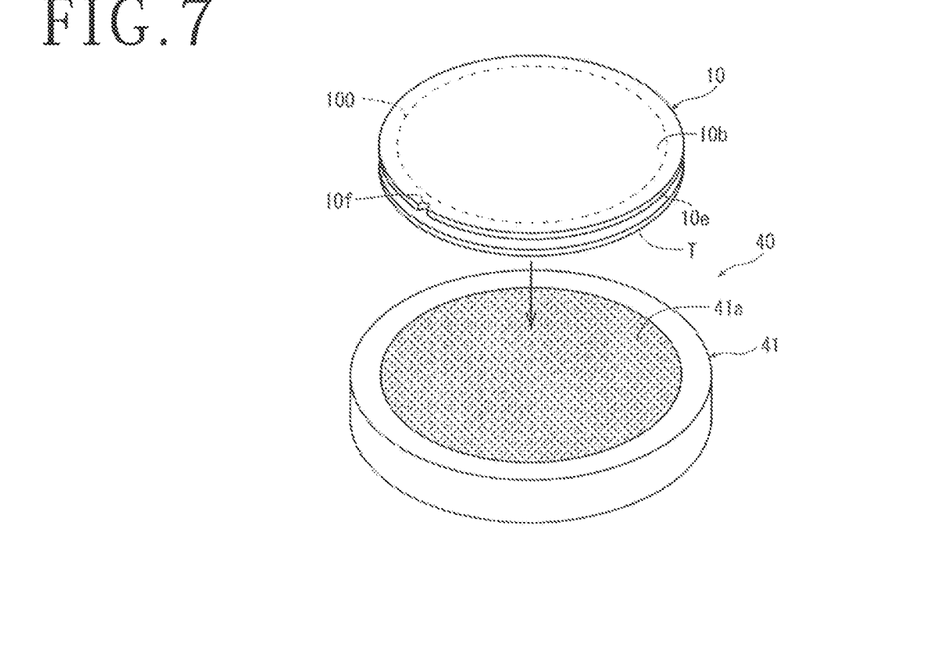
FIG. 7 is a perspective view depicting a mode of placing a wafer on a chuck table for carrying out a first wafer grinding step.
Figure 8A:
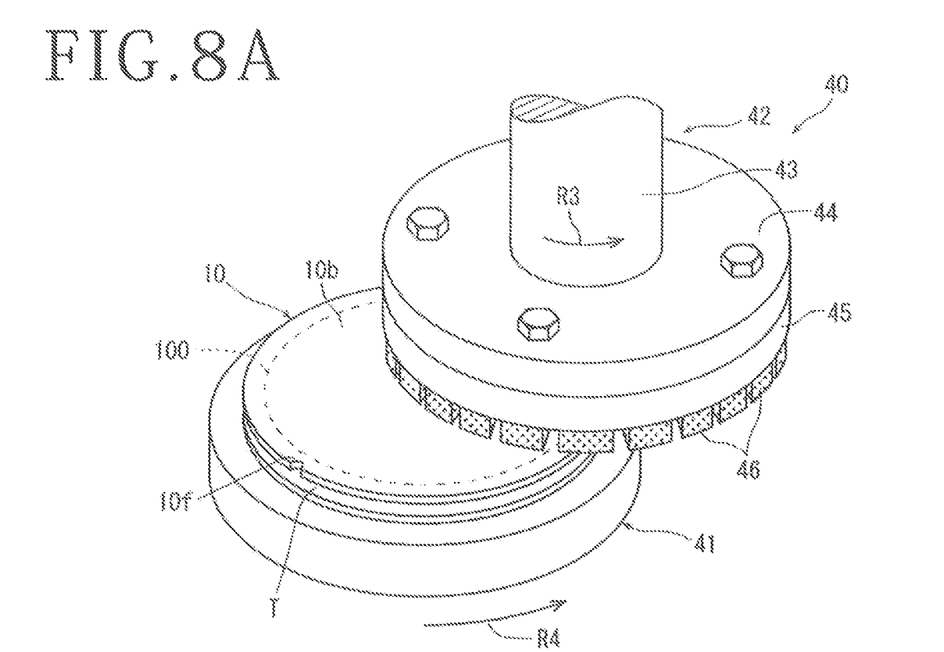
FIG. 8A is a perspective view depicting an embodiment of the first wafer grinding step.

After the annular modified layer forming step and the protective tape disposing step described above are carried out, the wafer W with the protective tape T disposed thereon is conveyed to the grinding apparatus 40 depicted in FIGS. 7 and 8A, in order to carry out the first wafer grinding step on the wafer W. Note that, as the grinding apparatus 40 used in carrying out the second wafer grinding step described above is used, detailed description of the grinding apparatus 40 is omitted.

After the wafer W is conveyed to the grinding apparatus 40, the conveyed wafer W is placed and suction held on the holding surface 41a of the chuck table 41, with the protective tape T side directed to the lower side and with the back surface 10b of the first wafer 10 directed to the upper side. After the wafer W is suction held on the chuck table 41, while rotating the spindle 43 of the grinding means 42 in the direction indicated by an arrow R3 in FIG. 8A at, for example, 6,000 rpm, the chuck table 41 is rotated in the direction indicated by an arrow R4 at, for example, 300 rpm. Then, the grindstones 46 are put into contact with the back surface 10b of the first wafer 10, and the grinding wheel 45 is put into grinding feeding in the direction perpendicular to the first wafer 10 at a grinding feeding speed of, for example, 1 μm/second. In this instance, the grinding can be advanced while measuring the thickness of the wafer W by a contact-type measuring gauge, not illustrated. Here, the action of the modified layer 100 formed by the above-described annular modified layer forming step will be described referring to FIG. 8.

Figure 8B:
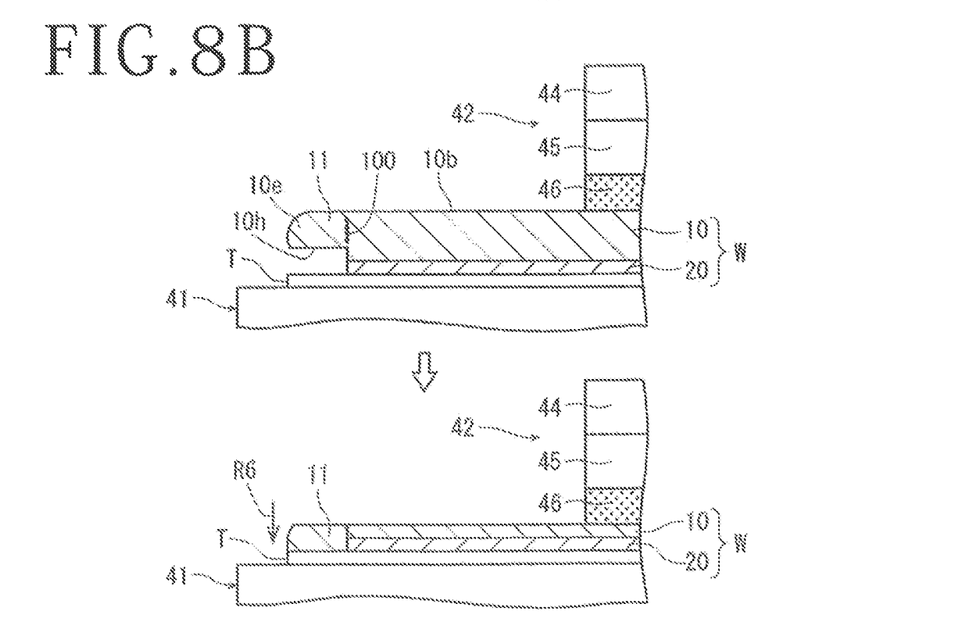
FIG. 8B is a partial enlarged sectional view depicting a grinding process of the first wafer grinding step.
Figure 9A:
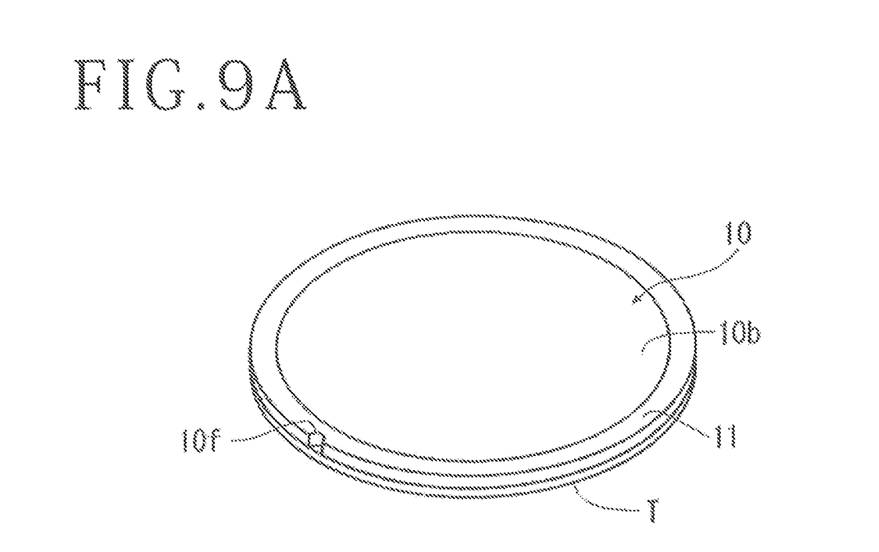
FIG. 9A is a perspective view of a wafer having been processed by the present embodiment.

When grinding of the back surface 10b of the first wafer 10 is advanced, as depicted in FIG. 8A, the thickness of the first wafer 10 illustrated at the upper part of FIG. 8B is gradually decreased. In this instance, a strong stimulus (external force) such as rotational vibration or a pressing force is exerted on the wafer W from the grindstones 46 of the grinding means 42. This stimulus acts on the annular modified layer 100 formed inside the first wafer 10, whereby cracks gradually extend in the vertical direction from the modified layer 100, and a ring-shaped region inclusive of the chamfered part 10e and the stepped part 10h is gradually separated from the first wafer 10 along the modified layer 100. Then, a ring member 11 composed of the ring-shaped region including the stepped part 10h is completely separated from the first wafer 10 as illustrated at the lower part of FIG. 8B, and drops in the direction indicated by an arrow R6, that is, onto the protective tape T. Since an adhesive force is imparted to the protective tape T and the ring member 11 dropped from the first wafer 10 is strongly pressed from above by the grinding means 42, the ring member 11 is adhered onto the protective tape T, without rotating. Then, the ring member 11 is ground together with the first wafer 10, and the wafer W of the two-layer structure having the first wafer 10 and the second wafer 20 laminated on each other comes to have a predetermined thickness, and comes into the state as depicted in FIG. 9A.

As described above, the ring member 11 drops without rotating relative to the ring member 11 before separation from the first wafer 10, and is adhered onto the protective tape T. Therefore, the position of the notch 10f of the first wafer 10 that is left in the ring member 11 indicates not only the crystal orientation of the first wafer 10 but also the crystal orientation of the second wafer 20, even after the ring member 11 is separated from the first wafer 10 and drops. Therefore, the notch 10f can be utilized as one indicative of the crystal orientation of the wafer W, in other steps carried out after the first wafer grinding step described above, for example, the step of dividing the wafer W into individual device chips by a dicing apparatus or a laser processing apparatus. Thus, the problem that the crystal orientation is not known in the subsequent steps and a trouble is thereby generated is solved. In addition, since the ring member 11 is left, the outside diameter of the wafer W inclusive of the ring member 11 is maintained from the state before processing. Therefore, the problem that, in the case where the chamfered parts 10e and 20e are removed, the outside diameter size of the wafer W is reduced and the size of the chuck table becomes unsuitable is also solved. Note that, in a case where at the time of forming the modified layer 100 in the above-described annular modified layer forming step, the application of the laser beam LB1 is started while first positioning the focal point of the laser beam LB1 at a position in the vicinity of the base of the stepped part 10h and the modified layer 100 is formed such as to gradually spread toward the peripheral end side of the wafer W, that is, such that the modified layer 100 is inclined, as the focal point is moved toward the back surface 10b side of the first wafer 10, the dropping of the ring member 11 occurs more easily in the first wafer grinding step.

According to the present invention, the above-described embodiment is not limitative, and various modifications are provided. In the embodiment described above, the protective tape disposing step is subsequently carried out after the second wafer grinding step. However, the present invention is not limited to this, and, for example, a step of forming division start points for dividing the wafer W into individual device chips may be carried out from the second wafer side at a certain timing after the second wafer grinding step is carried out and before the protective tape disposing step is carried out. Referring to FIG. 10, a specific example of the above-described step of forming the division start points will be described below. Note that the step described below is described as being carried out after the second wafer grinding step described above and before the annular modified layer forming step is carried out, but the step described below may be carried out after the modified layer forming step and before the protective tape disposing step is carried out.

Figures 10A, 10B:
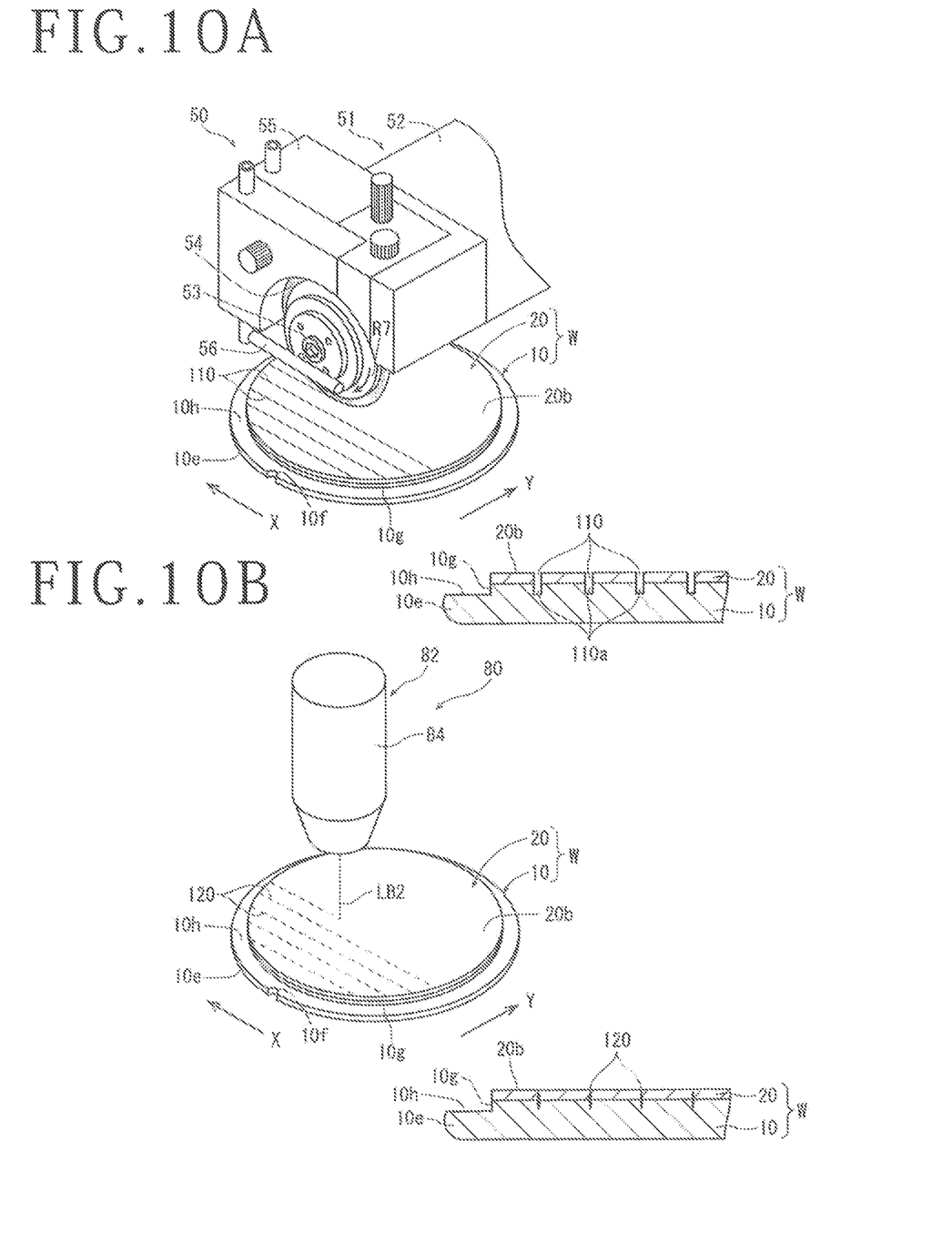
FIG. 10A depicts a perspective view depicting an embodiment of a cut grove forming step and a partial enlarged sectional view of a wafer having formed with cut grooves.
FIG. 10B depicts a perspective view depicting an embodiment of a street modified layer forming step and a sectional view depicting, in an enlarged form, a part of a wafer formed with modified layers.

FIG. 10A depicts an embodiment of a step (cut groove forming step) of forming cut grooves including grooves of a depth corresponding to a finished thickness of the first wafer 10 by cutting from the second wafer 20 side to reach the first wafer 10, as division start points for dividing the wafer W into individual device chips, after the second wafer grinding step is carried out.

The wafer W having undergone the second wafer grinding step is conveyed to a second cutting apparatus 50 illustrated in FIG. 10A. The second cutting apparatus 50 includes a chuck table (illustration is omitted) for suction holding the wafer W, cutting means 51, and moving means (illustration is omitted) for relatively moving the chuck table and the cutting means 51 in an X-axis direction indicated by an arrow X, a Y-axis direction indicated by an arrow Y, and a rotating direction. The cutting means 51 includes a cutting blade 54 that is fixed to a tip end portion of a spindle 53 supported by a spindle housing 52 and has a cutting edge at a periphery thereof, and a blade cover 55 that covers the cutting blade 54. The blade cover 55 is provided with cutting water supply means 56 disposed at a position adjacent to the cutting blade 54, for supplying cutting water toward a cutting position, the cutting water being introduced through the blade cover 55. A rotational drive source, not illustrated, such as a motor is disposed on the other end side of the spindle 53, and, with the spindle 53 rotated by the rotational drive source, the cutting blade 54 is rotated in the direction indicated by an arrow R7.

In carrying out the cut groove forming step by the second cutting apparatus 50 described above, first, the wafer W held by the chuck table is imaged by use of imaging means (illustration is omitted) for alignment. The imaging means includes infrared ray applying means and an infrared camera capable of detecting the streets 14 and the streets 24 on the front surface 10a of the first wafer 10 and the front surface 20a of the second wafer 20 through the wafer W, and detects the positions of the streets 14 and 24 (see FIG. 1) formed on the front surfaces 10a and 20a of the first wafer 10 and the second wafer 20 constituting the wafer W. After the streets 14 and 24 are detected and the position information is stored in appropriate control means (illustration is omitted), the wafer W held by the chuck table and the cutting means 51 are put into processing feeding by relatively moving in the X-axis direction and appropriately put into indexing feeding in the Y-axis direction, based on the position information, to cut from the second wafer 20 side to reach the first wafer 10, whereby cut grooves 110 including grooves 110a of a depth corresponding to the finished thickness of the first wafer 10 are formed along the streets 14 and 24, as depicted at the lower part of FIG. 10A. Further, the chuck table is rotated by 90°, and cut grooves 110 are similarly formed along the streets 14 and 24 also in the direction orthogonal to the previously formed cut grooves 110. In this way, the cut grooves 110 are formed along all the streets 14 and 24 of the wafer W.

Figure 9B:
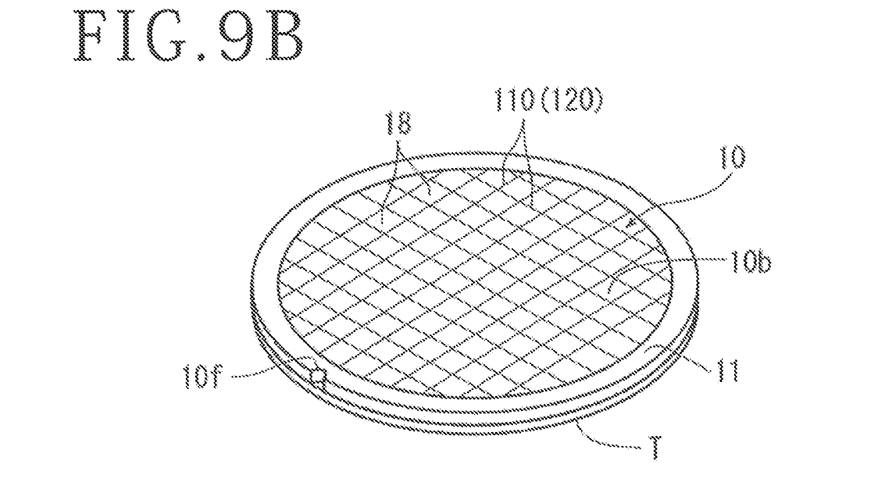
FIG. 9B is a perspective view of another wafer having been processed by another embodiment.

In a case where the cut groove forming step is carried out, in addition to the above-described wafer processing method, at a certain timing of after the second wafer grinding step and before the protective tape disposing step, when the first wafer grinding step described above referring to FIG. 8 is carried out to bring the first wafer 10 to the finished thickness, the ring member 11 including the stepped part 10h is separated along the modified layer 100 and drops in the direction indicated by the arrow R6, as depicted in FIG. 8B, and the wafer W is divided along the cut grooves 110 into individual device chips 18, as illustrated in FIG. 9B.

As the step of forming the division start points for dividing the wafer W into the individual device chips, a street modified layer forming step of forming modified layers ranging from the second wafer 20 side to the first wafer 10 may be carried out, in place of the above-described cut groove forming step. This will be described more specifically, referring to FIG. 10B.

The wafer W having undergone the second wafer grinding step is conveyed to a second laser processing apparatus 80 illustrated in FIG. 10B. The second laser processing apparatus 80 includes a chuck table, not illustrated, laser beam applying means 82, and moving means, not illustrated, that relatively moves the chuck table and the laser beam applying means 82. The laser beam applying means 82 includes a laser oscillator that oscillates a laser beam of such a wavelength as to be transmitted through the first wafer 10 and the second wafer 20, and an optical system (both omitted from illustration) including output adjusting means, and has a function of applying a laser beam LB2 from a condenser 84 including a condenser lens.

In carrying out the street modified layer forming step by the second laser processing apparatus 80 described above, first, the wafer W held by the chuck table is imaged by use of imaging means (illustration is omitted) for alignment. The imaging means includes infrared ray applying means and an infrared camera capable of detecting the streets 14 and the streets 24 on the front surface 10a of the first wafer 10 and the front surface 20a of the second wafer 20 through the wafer W, and detects a region to be processed that is formed on the front surface 10a of the first wafer 10 and the front surface 20a of the second wafer 20, the first wafer 10 and the second wafer 20 constituting the wafer W, that is, a position where the streets 14 and 24 (see FIG. 1) overlap with each other. After the streets 14 and 24 are detected and the position information is stored in appropriate control means (illustration is omitted), the condenser 84 is positioned on an upper side of a processing starting position of the streets 14 and 24 of the wafer W held on the chuck table, based on the position information.

Next, the position of the condenser 84 in the vertical direction is adjusted, and the focal point of the laser beam LB2 is positioned in the vicinity of a depth position corresponding to the finished thickness of the first wafer 10. Further, based on the position information, the wafer W held on the chuck table and the laser beam applying means 82 are put into processing feeding by relatively moving in the X-axis direction and appropriately put into indexing feeding in the Y-axis direction, to thereby form the modified layers 120 along all the streets 14 and 24 of the wafer W. Furthermore, the chuck table is rotated by 90°, and the modified layers 120 are similarly formed along the streets 14 and 24 also in the direction orthogonal to the previously formed modified layers 120. Note that the laser processing for forming the modified layers 120 is repeatedly conducted while the focal point of the laser beam LB2 is gradually raised from the vicinity of the depth position corresponding to the finished thickness of the first wafer 10 to the vicinity of the back surface 20b of the second wafer 20, whereby the modified layers 120 are formed to straddle both the first wafer 10 and the second wafer 20, as illustrated in the lower part of the FIG. 10B. In this way, the modified layers 120 are formed along all the streets 14 and 24 of the wafer W.

Note that the laser processing conditions in carrying out the street modified layer forming step described above are set, for example, as follows.

Wavelength: 1,342 nm
Repetition frequency: 90 kHz
Average output: 1.2 W
Processing feeding speed: 700 mm/second In a case where the street modified layer forming step is carried out after the second wafer grinding step and before the protective tape disposing step as described above, also, when the first wafer grinding step described above referring to FIG. 7 is carried out to bring the first wafer 10 to the finished thickness, the ring member 11 formed in the peripheral surplus region including the chamfered part 10e is separated from the first wafer 10 and drops onto the protective tape T to be adhered to the protective tape T, as depicted in FIG. 8B, and the wafer W is divided along the modified layers 120 into individual the device chips 18.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for processing a wafer of a two-layer structure having a second wafer laminated on a front surface of a first wafer, the first wafer being provided on the front surface with a device region in which a plurality of devices are formed in a state of being partitioned by a plurality of intersecting streets and a peripheral surplus region surrounding the device region, the wafer processing method comprising:
   a stepped part forming step of cutting from the second wafer side to the peripheral surplus region of the first wafer to a depth corresponding to a finished thickness of the first wafer, thereby removing a chamfered part formed at a peripheral end of the second wafer and forming an annular stepped part in the peripheral surplus region of the first wafer;
   a second wafer grinding step of, after the stepped part forming step is carried out, grinding an exposed surface of the second wafer to make the second wafer have a predetermined thickness;
   an annular modified layer forming step of, after the second wafer grinding step is carried out, applying a laser beam of such a wavelength as to be transmitted through the first wafer while positioning a focal point of the laser beam inside a base of the stepped part formed in the peripheral surplus region of the first wafer to form an annular modified layer;
   a protective tape disposing step of, after the annular modified layer forming step is carried out, disposing a protective tape of a size corresponding to the first wafer on the exposed surface of the second wafer; and
   a first wafer grinding step of, after the protective tape disposing step is carried out, grinding an exposed surface of the first wafer to give a stimulus to the modified layer, to separate a ring-shaped region including the stepped part from the first wafer along the modified layer, to drop the region onto the protective tape, and to grind the first wafer to the finished thickness.

2. The wafer processing method according to claim 1, further comprising:
   a cut groove forming step of, after the second wafer grinding step and before the protective tape disposing step, cutting from the second wafer side to the streets of the first wafer to form cut grooves including grooves of a depth corresponding to the finished thickness of the first wafer,
   wherein, in the first wafer grinding step, the wafer of the two-layer structure is divided into individual device chips.

3. The wafer processing method according to claim 1, further comprising:
   a street modified layer forming step of, after the second wafer grinding step and before the protective tape disposing step, applying a laser beam of such a wavelength as to be transmitted through the first wafer and the second wafer from the second wafer side to form modified layers ranging from the second wafer to the streets of the first wafer,
   wherein, in the first wafer grinding step, the wafer of the two-layer structure is divided into individual device chips.

* * * * *